(12) United States Patent
Hueting

(10) Patent No.: US 6,509,608 B1
(45) Date of Patent: Jan. 21, 2003

(54) TRENCH-GATE FIELD-EFFECT TRANSISTORS AND THEIR MANUFACTURE

(75) Inventor: Raymond J. E. Hueting, Helmond (NL)

(73) Assignee: Koninklijke Philips Electronics N.V., Eindhoven (NL)

( * ) Notice: Subject to any disclaimer, the term of this patent is extended or adjusted under 35 U.S.C. 154(b) by 0 days.

(21) Appl. No.: 09/618,187

(22) Filed: Jul. 18, 2000

(30) Foreign Application Priority Data

Jul. 20, 1999 (GB) .............................................. 9916868

(51) Int. Cl.⁷ .............................................. H01L 29/76
(52) U.S. Cl. ........................ 257/330; 253/333; 438/138
(58) Field of Search ................................. 257/330, 331, 257/333; 438/133, 138, 270, 271

(56) References Cited

U.S. PATENT DOCUMENTS

| | | | |
|---|---|---|---|
| 5,134,448 A | | 7/1992 | Johnsen et al. |
| 5,424,231 A | * | 6/1995 | Yang |
| 5,637,898 A | | 6/1997 | Baliga ........................ 257/330 |
| 6,015,725 A | * | 1/2000 | Hirayama |
| 6,262,453 B1 | * | 7/2001 | Hshieh |

FOREIGN PATENT DOCUMENTS

EP 0833392 A2 4/1998

* cited by examiner

*Primary Examiner*—Tuan H. Nguyen
(74) *Attorney, Agent, or Firm*—Steven R. Biren

(57) ABSTRACT

In a trench-gate field-effect transistor of inverted configuration, the drain region (14) is adjacent to the surface with the insulated trench-gate structure (11,12). The gate dielectric 12 is thicker adjacent to the drain region (14), and preferably also the drain drift region (14a), than it is adjacent to the channel-accommodating portion (15a) of the transistor body region (15). Another portion (15b) of the transistor body region (15) is electrically shorted to the underlying source region (13) by a buried electrical short (35). This buried short is provided by a leaky p-n junction (35) between a highly doped (p+) bottom portion (15b) of the body region and the underlying source region (13), at an area that is separated laterally from the insulated gate electrode (11) by an active portion (13a) of the source region adjacent to the gate trench (20). This portion (13a) of the source region can be formed by dopant implantation and/or diffusion via the lower portion of the trench (20). It extends across the highly doped bottom portion (15b) of the body region to connect with the channel-accommodating portion (15a) adjacent to the trench-gate structure (11,12). A compact layout of drain and trench-gate structures is achievable at the body surface (10a), and a compact layout of the buried electrical short (35) is achievable with the underlying source region (13).

11 Claims, 2 Drawing Sheets

TRENCH-GATE FIELD-EFFECT TRANSISTORS AND THEIR MANUFACTURE

BACKGROUND OF THE INVENTION

This invention relates to trench-gate field-effect transistors in which an insulated trench-gate structure extends to an underlying source region from a drain region adjacent to a major surface of the semiconductor body. The invention also relates to methods of manufacturing such transistors.

Trench-gate field-effect transistors are known, comprising a semiconductor body into which an insulated gate electrode extends in a trench from a major surface of the body. The trench extends through a channel-accommodating portion of a body region of a first conductivity type between drain and source regions of an opposite second conductivity type. Usually the source region is adjacent to the said major surface, where it is electrically shorted to a part of the body region.

United States patent specification U.S. Pat. No. 5,134,448 discloses a trench-gate field-effect transistor of what may be termed an inverted configuration, in which the drain region is adjacent to the said major surface with the insulated gate electrode. In this case, the insulated gate electrode extends in a trench from a major surface of the body, successively through a drain region, a lower-doped drain drift region, and a transistor body region to reach an underlying source region of the transistor. A part of the body region is electrically shorted to the underlying source region by a buried electrical short. The whole contents of U.S. Pat. No. 5,134,448 are hereby incorporated herein as reference material.

U.S. Pat. No. 5,134,448 teaches burying the electrical short at the bottom of a trench, where it is formed by a variety of ohmic-contact means. Such means include a metal (for example, Al, Ti, W, Mo, Ta, Ni, Cr, Pt, or alloy thereof), an intermetallic with the semiconductor, and a degenerate semiconductor. The layout area of the device is significantly increased when an extra trench (separate from that of the trench-gate) is provided specifically for the electrical short. The trench-gate structure becomes complicated when the electrical short is provided at the same trench as the insulated gate electrode.

SUMMARY OF THE INVENTION

It is an aim of the present invention to provide a trench-gate transistor of inverted configuration, which can have a compact layout of drain and trench-gate structures at the body surface and a buried source-body region short that does not complicate the trench structure of the insulated gate electrode.

According to a first aspect of the invention, there is provided a trench-gate field-effect transistor of inverted configuration, in which the insulated gate electrode extends in a trench lined with gate dielectric that insulates the gate electrode from the drain region, a drain drift region, the transistor body region and the underlying source region. The gate dielectric is thicker adjacent to the drain region than adjacent to a channel-accommodating portion of the body region. A more highly doped bottom portion of the body region forms a leaky p-n junction with the underlying source region at an area that is separated laterally from the insulated gate electrode by an active portion of the source region adjacent to the trench. The leaky p-n junction provides the buried electrical short. The body region comprises an overlying layer that provides the channel-accommodating portion and that is less highly doped than the bottom portion. The active portion of the source region extends across the highly doped bottom portion of the body region to connect with the channel-accommodating portion of the body region adjacent to the trench.

Such an arrangement of the trench for the insulated gate electrode with respect to the various transistor regions permits a compact layout of the transistor. In particular a compact layout of drain and trench-gate structures is achievable at the body surface, and a compact layout of the buried electrical short is achievable with the underlying source region. Premature breakdown between gate and drain across the gate dielectric is avoided by making the gate dielectric to be thicker adjacent to the drain region than adjacent to the channel-accommodating portion of the body region. A thicker dielectric may also be advantageously provided adjacent to the lower-doped drain drift region, for example in a power device with cells which are so closely packed that the drift region is depleted by RESURF action from neighbouring trench-gate portions in the voltage blocking state of the device.

In order to permit the provision of the buried electrical short in a simple manner, it is advantageous for the highly doped bottom portion of the body region to be in the form of a layer that extends laterally to the gate trench where it is overdoped by the said active portion of the source region. In this case, the active portion of the source region can be formed by dopant implantation and/or diffusion. Thus, its doping concentration profile of the second conductivity type may be implanted at the bottom of a trench in the semiconductor body before the gate electrode is provided in the trench. Its final doping profile of the second conductivity type may correspond to a dopant diffusion profile from the bottom of the trench.

According to a second aspect of the invention there are also provided advantageous methods of manufacturing trench-gate field-effect transistors in accordance with the first aspect.

Some of the particularly advantageous technical features and some of the options available with the invention are summarized in the appended Claims.

The present invention is particularly advantageous for realising power devices with a compact transistor layout geometry. Such devices generally comprise a plurality of the body regions that are located side-by-side in the semiconductor body, with grid portions of the trench-gate structure in-between. The realisation of the electrical short in accordance with the present invention permits a close spacing of these grid portions, and even permits the active portion of the source region to be provided in a self-aligned manner around the bottom of each grid portion of the gate trench.

The drain drift region is lower doped than the drain region and so has a lower conductivity. In order to reduce the on-resistance of the device, it is advantageous for the drain drift region to have a doping concentration of the second conductivity type that increases towards the drain region. This can be readily achieved with the inverted configuration of the transistor by, for example implanting and/or diffusing dopant from the surface of the drain region and/or from the surface of the drift region before providing the drain region. Different doping profiles can easily be produced in this way for the drift region.

BRIEF DESCRIPTION OF THE DRAWING

These and other advantageous features in accordance with the present invention are illustrated in specific embodiments now described, by way of example, with reference to the accompanying diagrammatic drawings, in which.

Figure 1:
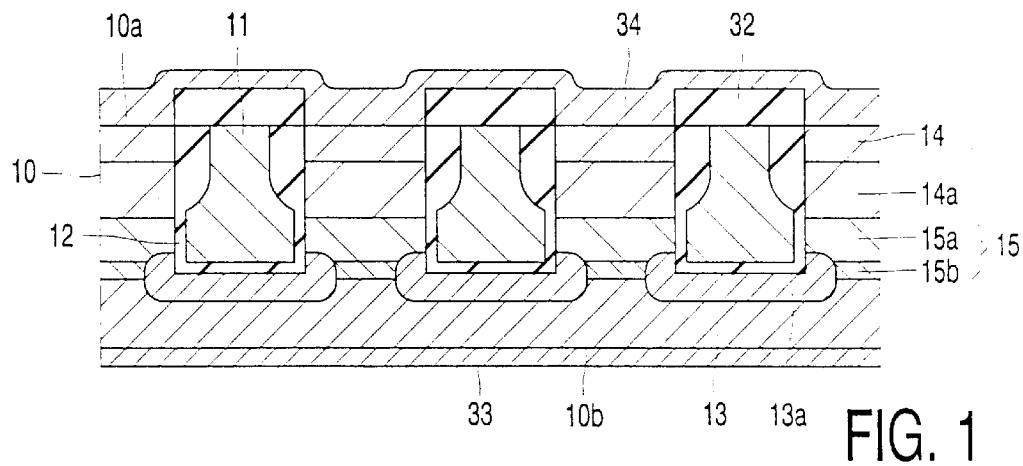
FIG. 1 is a cross-sectional view of an active central part of a trench-gate field-effect power transistor in accordance with the invention.

It should be noted that all the Figures are diagrammatic. Relative dimensions and proportions of parts of the drawings have been shown exaggerated or reduced in size, for the sake of clarity and convenience in the drawings. The same reference signs are generally used to refer to corresponding or similar features in modified and different embodiments.

DESCRIPTION OF THE PREFERRED EMBODIMENTS

FIG. 1 illustrates an exemplary embodiment of a cellular trench-gate field-effect power transistor in accordance with the invention. The transistor comprises a semiconductor body 10 having a top major surface 10a from which an insulated gate electrode 11 extends in a trench 20 into the body 10. The gate electrode 11 is present on a gate dielectric layer 12 that lines the trench 20.

This insulated trench-gate structure 11,12 extends through a channel-accommodating portion 15a of a body region 15 of a first conductivity type (p-type in this embodiment), between drain and source regions 14 and 13 of an opposite second conductivity type (n-type in this embodiment). Thus, the transistor is of the MOSFET type, in which the gate electrode 11 is capacitively coupled to the channel-accommodating portion 15a of the body region 15 across the intermediate gate dielectric 12. The application of a voltage signal to the gate electrode 11 in the on-state of the device serves in known MOSFET manner for inducing a conduction channel 22 in the region portion 15a and for controlling current flow in this conduction channel 22 between the source and drain regions 13 and 14.

The transistor is of an inverted configuration, in which the drain region 14 is adjacent to the top surface 10a. Thus, the gate trench 20 extends successively through the drain region 14, or drain drift region 14a, and the body region 15 into an underlying portion of the source region 13. The drain region 14 is contacted at the top major surface 10a by a drain electrode 34. The drain electrode 34 extends over the gate electrode 11 from which it is insulated by an intermediate insulating layer 32. The drain drift region 14a is of lower doping concentration (n−) than the drain region 14 (n+) and is present between the drain region 14 and the underlying body region 15.

In accordance with the present invention, the gate dielectric 12 insulates the gate electrode 11 from the successive regions 14, 14a, 15 and 13 and is thicker adjacent to the drain region 14 than adjacent to a channel-accommodating portion 15a of the body region 15. Preferably, the gate dielectric 12 has a thickness that increases progressively adjacent to the drain drift region 14a with distance from the channel-accommodating portion 15a of the body region 15.

Figure 2:
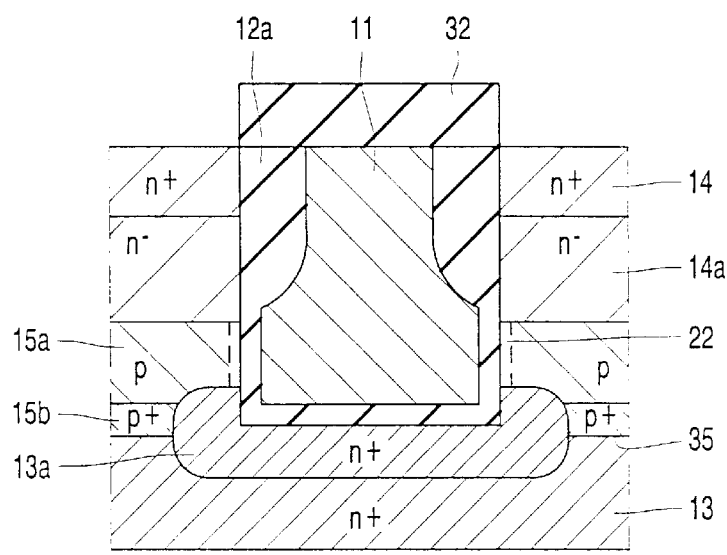
FIG. 2 is an enlarged cross-sectional view of the transistor structure of FIG. 1, in the vicinity of a grid portion of the trench-gate structure.

FIGS. 1 and 2 illustrate this increase to the thick dielectric layer portion 12a adjacent to the drain region 14.

In the inverted configuration of this transistor, a part of the body region 15 is electrically shorted to the underlying source region 13 by a buried electrical short 35 in accordance with the present invention. This short 35, which is described below, pins the potential of the body region 15 to that of the source region 13. By way of example, FIG. 1 shows a discrete vertical device structure in which the source region 13 is a substrate of high conductivity (n+ in this example), which is contacted by the source electrode 33 at the bottom major surface 10b of the body 10.

The transistor typically comprises tens of thousands of parallel device cells in the semiconductor body 10 adjacent to the body surface 10a. The number of cells is dependent on the desired current-carrying capability of the device. Transistors in accordance with the invention may have any one of a variety of known cell geometries, for example an hexagonal close-packed geometry, or a square geometry, or an elongate stripe geometry. In each case, the device has a plurality of the body regions 15 which are located side-by-side in the semiconductor body 10, and the trench-gate structure 11,12 comprises grid portions which extend between the channel-accommodating portions 15a of the neighbouring side-by-side body regions 15, as illustrated in FIG. 1. The source region 13 is common to all the cells. The active cellular area of the device may be bounded around the periphery of the body 10 by various known peripheral termination schemes. Such schemes normally include the formation of a thick field-oxide layer at the peripheral area of the body surface 10a, before the transistor cell fabrication steps.

In accordance with the present invention, a leaky p-n junction 35 provides the buried electrical short between the transistor body region 15 and the underlying source region 13. The body region 15 comprises an overlying layer 15a that provides the channel-accommodating portion and that extends over a bottom portion 15b of the body region that is more highly doped (p+) than the overlying layer 15a (p). This highly doped bottom portion 15b forms the leaky p-n junction 35 with the underlying source region 13 at an area that is separated laterally from the insulated gate electrode 11 by the gate dielectric 12 and by an active portion 13a of the source region 13 adjacent to the gate trench 20. This active portion 134a of the source region 13 extends across the thickness of the highly doped bottom portion 15b of the body region 15 to connect with the channel-accommodating portion 15a. This active portion 13a of the source region 13 extends around the bottom of each grid portion of the insulated trench-gate structure 11,12, as illustrated in FIGS. 1 and 2.

Typically, the body 10 is of monocrystalline silicon, the gate electrode 11 is of doped polycrystalline on a gate insulating layer 12 of silicon dioxide, and the electrodes 33 and 34 are of, for example, aluminium. In a typical embodiment, the doping concentration (p+) of the high-doped portion 15b may be, for example, $10^{18}$ to $10^{19}$ boron atoms $cm^{-3}$, that (p) of the channel-accommodating portion 15a may be, for example, $10^{16}$ to $10^{17}$ boron atoms $cm^{-3}$, that (n+) of the active source portion 13a of the may be, for example, $10^{19}$ to $10^{21}$ phosphorus or arsenic atoms $cm^{-3}$, and the dopant concentration (n+) of the source and drain regions may be, for example, $10^{20}$ to $10^{22}$ phosphorus or arsenic atoms $cm^{-3}$. Typically the tunnelling current across the resulting p-n junction 35 is of the order of 10 to 100 amps. $cm^{-2}$. Thus, the total leakage current across the p-n junction 35 with an area of 15 $mm^2$ may be in the range of, for example, 1.5 to 15 amps. The lower doped drain drift region 14a may have a doping concentration (n−) that is uniform or that reduces with depth, for example from about $3 \times 10^{17}$ at the interface with drain region 14 to about $10^{16}$ at the interface with the body region 15.

Figure 3:
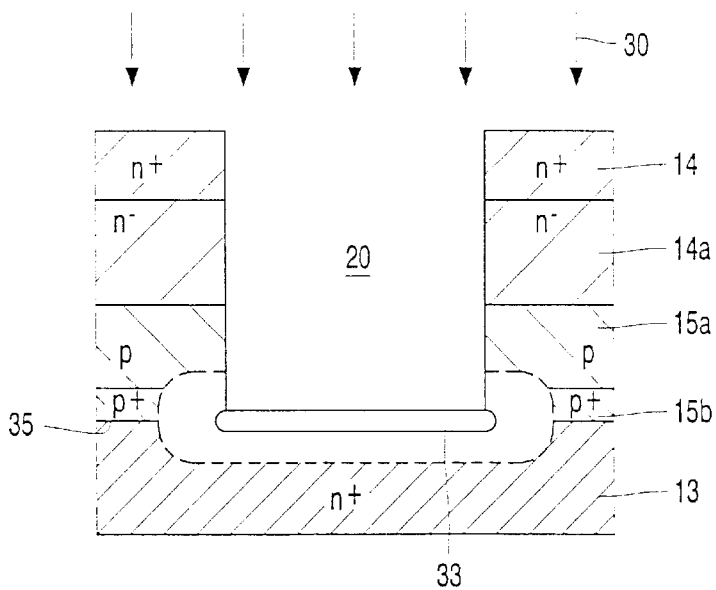
FIG. 3 is a cross-sectional view of the transistor structure of FIG. 2, at a stage in the manufacture of the device.

In the case of the discrete vertical device structure illustrated in FIGS. 1 and 2, the highly doped bottom portion 15b of the body region 15, the channel-accommodating portion 15a of the body region 15, the drain drift region 14a and the drain region 14 may be formed as a stack of epitaxial layers on the substrate 13. In this case, the layer that forms the highly doped bottom portion 15b of the body region 15 extends laterally to the trench-gate structure 11,12 where it is overdoped by the active portion 13a of the source region 13. FIG. 3 illustrates a step in the manufacture of such a structure.

Thus, FIG. 3 illustrates an ion implantation step that is carried out after etching the trench 20 through the stacked epitaxial layers 14, 14a, 15a, 15b and before providing the insulated trench-gate structure 11,12 in the trench 20. The ions 30 may be of arsenic or phosphorus and are implanted at the bottom of a trench 20 in the semiconductor body 10 so as to provide the doping n+ for the active portion 13a of the source region 13. The doping n+ for the active portion 13a is self-aligned with the trench 20, because outside the trench 20 the ions are implanted into the n-type drain region 14. A range of ion energies may be used to overdope the region portion 15b throughout its thickness, and/or the implanted dopant region 31 may be diffused in subsequent heat treatments, for example during the growth of the gate dielectric 12 and the deposition of the polysilicon gate 11. Thus, the resulting extension portion 13a of the source region 13 may have an n+ doping profile corresponding to a dopant diffusion profile from the bottom of the trench 20. This self-aligned process is readily compatible with a compact transistor layout geometry having a close spacing of the grid portions of the insulated gate structure 11,12.

Figure 4:
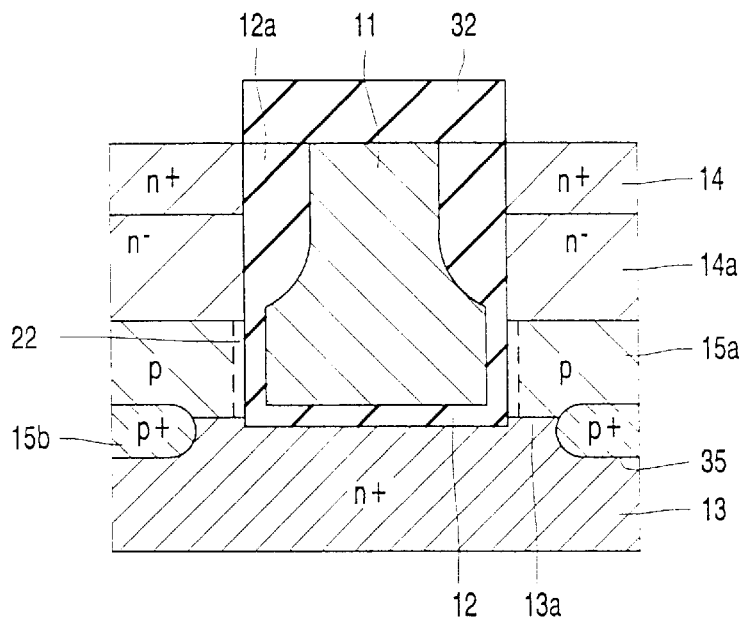
FIG. 4 is an enlarged cross-sectional view, similar to FIG. 2, of the transistor structure of another trench-gate field-effect device in accordance with the invention.

FIG. 4 illustrates an alternative device structure in accordance with the invention. In this case, the doping (p+) of the highly doped portion 15b of the body region 15 is provided only locally in the centre of each cell. A part of the substrate region 13 itself adjoins the bottom of the trench 20 and the channel-accommodating portion 15a of the body region 15. This part of the substrate region forms the active source portion 13a that laterally separates the leaky p-n junction 35 from the trench-gate structure 11,12 and that extends across the highly doped bottom portion 15b of the body region 15 to connect with the channel-accommodating portion 15a. As compared with FIGS. 1 to 3, the provision of the leaky junction 35 of the FIG. 4 device is less easily self-aligned with the trench 20. However, self-alignment can be achieved using spacer technology.

Figure 5:
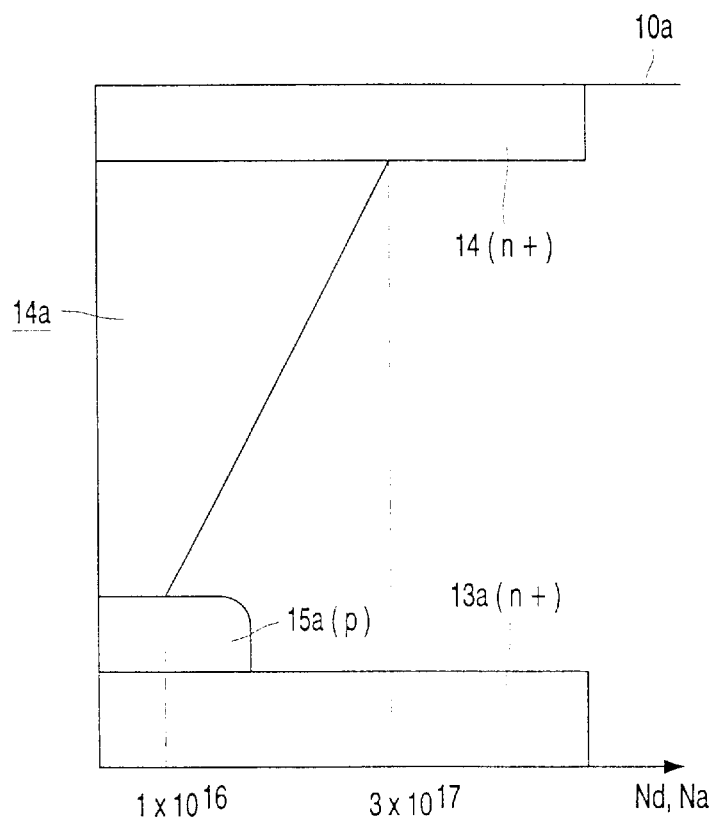
FIG. 5 shows doping profiles Nd (for n-type regions) and Na (for the p-type region) in $cm^{-3}$ through the regions 14, 14a, 15a, 13a for a specific embodiment of a drift region in a transistor device in accordance with the invention.

As mentioned before, the doping concentration of the drift region 14a may reduce with depth. Its higher doping concentration towards the drain region 14 can reduce the on-resistance of the device, while still permitting the drift region 14a to be depleted between neighbouring grid portions of the trench-gate structure 11,12 in a voltage-blocking state of the device. FIG. 5 illustrates a specific embodiment in which the doping profile Nd for the drift region 14a decreases substantially linearly from $3 \times 10^{17}$ cm$^{-3}$ in the vicinity of the drain region 14 to $10^{16}$ cm$^{-3}$ in the vicinity of the underlying body region 15a. This doping profile may be formed by in situ growth of the doped epitaxial material. However the inverted configuration of the transistor permits the doping profile of the drift region 14a to be formed by, for example, dopant implantation and/or diffusion from the surface 10a after growing all the epitaxial layers. At least part of the desired doping profile may, alternatively, be formed by dopant implantation and/or diffusion from the surface of an epitaxial layer 14a before growing or diffusing the drain region 14. Although FIG. 5 illustrates a linearly graded profile, different doping profiles can easily be produced in this way for the drift region 14a.

Although specific embodiments of high-voltage devices have been described, an inverted device structure in accordance with the invention may also be used for low-voltage devices. The substrate source 13,33 has a low inductance, and so inverted device structures in accordance with the invention can be used advantageously for high-frequency devices.

A conductively-doped polycrystalline gate electrode 11 has been described above. However, so as to reduce its resistance, the gate electrode 11 may include a metal silicide layer or may even be entirely of metal.

An n-channel device has been described with reference to FIGS. 1 to 4. However, a p-channel device is also possible in accordance with the invention, in which the regions 14, 14a, 13a and 13 are p-type, the body region portions 15a and 15b are n-type and the conduction channel 22 is of holes.

A vertical discrete device has been described with reference to FIGS. 1 to 3, having its source electrode 33 contacting the substrate 13 at the back surface 10b of the body 10. However, an integrated device is also possible in accordance with the invention. In this case, the source region 13 may be a doped buried layer between a device substrate and an epitaxial body region 15a and may be contacted by electrode 33 at the front major surface 10a via a doped peripheral contact region which extends from the surface 10a to the depth of the buried layer.

Furthermore, a device in accordance with the present invention may be of a so-called silicon-on-insulator (SOI) construction, in which the transistor structure (either vertical or horizontal) is formed in a monocrystalline silicon layer on an insulator. Thus, instead of being a wafer that is a few hundred micrometers (microns) thick, the semiconductor body 10 of a transistor in accordance with the invention may be a comparatively thin layer of monocrystalline silicon. Such a layer that is tens of micrometers (microns) thick can be carried on thicker substrate. The carrier substrate may be of, for example, monocrystalline silicon. The silicon layer may be bonded to the carrier substrate. In the case of a SOI construction, an insulating interface layer may be present at the carrier substrate surface.

Instead of silicon, other monocrystalline semiconductor materials may be adopted for the body 10, for example silicon carbide.

From reading the present disclosure, other variations and modifications will be apparent to persons skilled in the art. Such variations and modifications may involve equivalent and other features which are already known in the design, manufacture and use of semiconductor devices, and which may be used instead of or in addition to features already described herein.

Although Claims have been formulated in this Application to particular combinations of features, it should be understood that the scope of the disclosure of the present invention also includes any novel feature or any novel combination of features disclosed herein either explicitly or implicitly or any generalisation thereof, whether or not it relates to the same invention as presently claimed in any Claim and whether or not it mitigates any or all of the same technical problems as does the present invention.

The Applicants hereby give notice that new Claims may be formulated to any such features and/or combinations of such features during the prosecution of the present Application or of any further Application derived therefrom.

What is claimed is:

1. A trench-gate field-effect transistor comprising a semiconductor body into which an insulated gate electrode extends in a trench from a major surface of the body, successively through a drain region, a drain drift region, and a transistor body region to reach an underlying source region of the transistor, wherein the trench is lined with a gate dielectric that insulates the gate electrode from said drain, drain drift, body and source regions, the drain, drain drift and source regions are of a second conductivity type that is opposite to a first conductivity type of the body region, the drain region is adjacent to said major surface and has a higher doping concentration than the drain drift region, the gate dielectric is thicker adjacent to the drain region than adjacent to a channel-accommodating portion of the body region, the body region comprises an overlying layer that provides the channel-accommodating portion and that extends over a bottom portion of the body region that is more highly doped than the overlying layer, the highly doped bottom portion forms a leaky p-n junction with the underlying source region at an area that is separated laterally from the insulated gate electrode by an active portion of the source region, the active portion of the source region extends adjacent to the trench across the highly doped bottom portion of the body region to connect with the channel-accommodating portion of the body region, and the leaky p-n junction provides a buried electrical short that electrically shorts the body region to the underlying source region.

2. A transistor as claimed in claim 1, wherein the highly doped bottom portion of the body region is in the form of a layer that extends laterally to the trench where it is over-doped by the said active portion of the source region.

3. A transistor as claimed in claim 2, wherein the active portion of the source region has a doping profile of the second conductivity type corresponding to a dopant diffusion profile from the bottom of the trench.

4. A transistor as claimed in claim 1, wherein the drain drift region has a doping concentration of the second conductivity type that decreases from the vicinity of the drain region to the vicinity of the underlying body region.

5. A transistor as claimed in claim 1, wherein the gate dielectric has a thickness adjacent to the drain drift region that increases with distance from the channel-accommodating portion of the body region.

6. A transistor as claimed in claim 5, wherein the drain drift region has a substantially uniform doping concentration of the second conductivity type.

7. A transistor as claimed in claimed in claim 1, wherein the highly doped bottom portion of the body region, the channel-accommodating portion of the body region, the drain drift region and the drain region are in the form of stacked epitaxial layers on a monocrystalline semiconductor substrate that provides the underlying source region.

8. A transistor as claimed in claim 1, wherein the transistor is a power device having a plurality of the body regions which are located side-by-side in the semiconductor body, the insulated gate electrode in the trench comprises grid portions which extend between the channel-accommodating portions of neighbouring side-by-side body regions, and the active portion of the source region is present around the bottom of each grid portion of the trench.

9. A method of manufacturing a, trench-gate field-effect transistor having a semiconductor body into which an insulated gate electrode extends in a trench from a major surface of the body, successively through a drain region, a drain drift region, and a transistor body region to reach an underlying source region of the transistor, wherein the trench is lined with a gate dielectric that insulates the gate electrode from said drain, drain drift, body and source regions, the drain, drain drift and source regions are of a second conductivity type that is opposite to a first conductivity type of the body region, the drain region is adjacent to said major surface and has a higher doping concentration than the drain drift region, the gate dielectric is thicker adjacent to the drain region than adjacent to a channel-accommodating portion of the body region, the body region comprises an overlying layer that provides the channel-accommodating portion and that extends over a bottom portion of the body region that is more highly doped than the overlying layer, the highly doped bottom portion forms a leaky p-n junction with the underlying source region at an area that is separated laterally from the insulated gate electrode by an active portion of the source region, the active portion of the source region extends adjacent to the trench across the highly doped bottom portion of the body region to connect with the channel-accommodating portion of the body region, and the leaky p-n junction provides a buried electrical short that electrically shorts the body region to the underlying source region, including the steps of growing on a monocrystalline substrate stacked epitaxial layers for providing the highly doped bottom portion of the body region, the channel-accommodating portion of the body region, the drain drift region and the drain region, and thereafter etching a trench for the insulated gate electrode successively through the drain region, the drain drift region, and the transistor body region to reach the underlying source region.

10. A method of manufacturing a transistor as claimed in claim 9, wherein, before the gate electrode is provided in the trench, the doping concentration of the said active portion of the source region is implanted at the bottom of the trench in the semiconductor body to overdope the highly doped bottom portion of the body region.

11. A method of manufacturing a transistor as claimed in claim 9, wherein dopant of the second conductivity type is implanted into the drain drift region to provide the decreasing doping concentration of the drain drift region.

* * * * *